US007532443B2

(12) United States Patent
Kruger et al.

(10) Patent No.: US 7,532,443 B2
(45) Date of Patent: May 12, 2009

(54) CURRENT-LIMITING DEVICE HAVING A SUPERCONDUCTIVE SWITCHING ELEMENT

(75) Inventors: Ursaus Kruger, Berlin (DE); Ralf-Reiner Volkmar, Oldenburg (DE)

(73) Assignee: Siemens Aktiengesellschaft, Munich (DE)

( * ) Notice: Subject to any disclaimer, the term of this patent is extended or adjusted under 35 U.S.C. 154(b) by 161 days.

(21) Appl. No.: 11/630,506

(22) PCT Filed: Jun. 13, 2005

(86) PCT No.: PCT/DE2005/001089

§ 371 (c)(1),
(2), (4) Date: Dec. 21, 2006

(87) PCT Pub. No.: WO2006/000185

PCT Pub. Date: Jan. 5, 2006

(65) Prior Publication Data

US 2007/0217098 A1    Sep. 20, 2007

(30) Foreign Application Priority Data

Jun. 24, 2004    (DE)    ........................ 10 2004 031 908

(51) Int. Cl.
*H02H 7/00*    (2006.01)
*H02H 1/00*    (2006.01)
(52) U.S. Cl. ........................................................ 361/19
(58) Field of Classification Search .................... 361/19
See application file for complete search history.

(56) References Cited

U.S. PATENT DOCUMENTS

2003/0154734 A1 *    8/2003    Paul et al. ................. 62/259.2

FOREIGN PATENT DOCUMENTS

DE    102 30 084 A1    1/2004
DE    102 30 618 A1    1/2004

OTHER PUBLICATIONS

Shimizu H et al: "A study on required volume of superconducting element for flux flow resistance type fault current limiter" IEE Transactions on Applied Superconductivity IEEE USA, vol. 13, No. 2, Jun. 2003, pp. 2052-2055, XP002348609 ISSN: 1051-8223 abstract p. 2052, col. 1, paragraph 1—p. 2053, col. 1, paragraph 3 figure 1.

(Continued)

*Primary Examiner*—Ronald W Leja
(74) *Attorney, Agent, or Firm*—Young & Thompson

(57) ABSTRACT

An electrical current limiting device has a superconductive switching element. Unlike prior art superconductive current limiters whose switching mechanism is based on a quenching of the switching element, the inventive superconductive switching element is designed in such a manner that it is in the Shubnikov phase when the required short-circuit cutoff current is reached in the event current is limited. This enables the switching element to be operated in an operating state in which the generation of heat is limited to such an extent that the coolant surrounding the superconductor is able to completely dissipate the heat whereby achieving a stationary state at $T_S$. A quenching of the superconductor, which is associated with an exceeding of $T_C$, can thus be actively prevented so that, after an event in which current is limited, the superconductor is not required to be removed from the mains and recooled.

14 Claims, 2 Drawing Sheets

OTHER PUBLICATIONS

Figure 1:
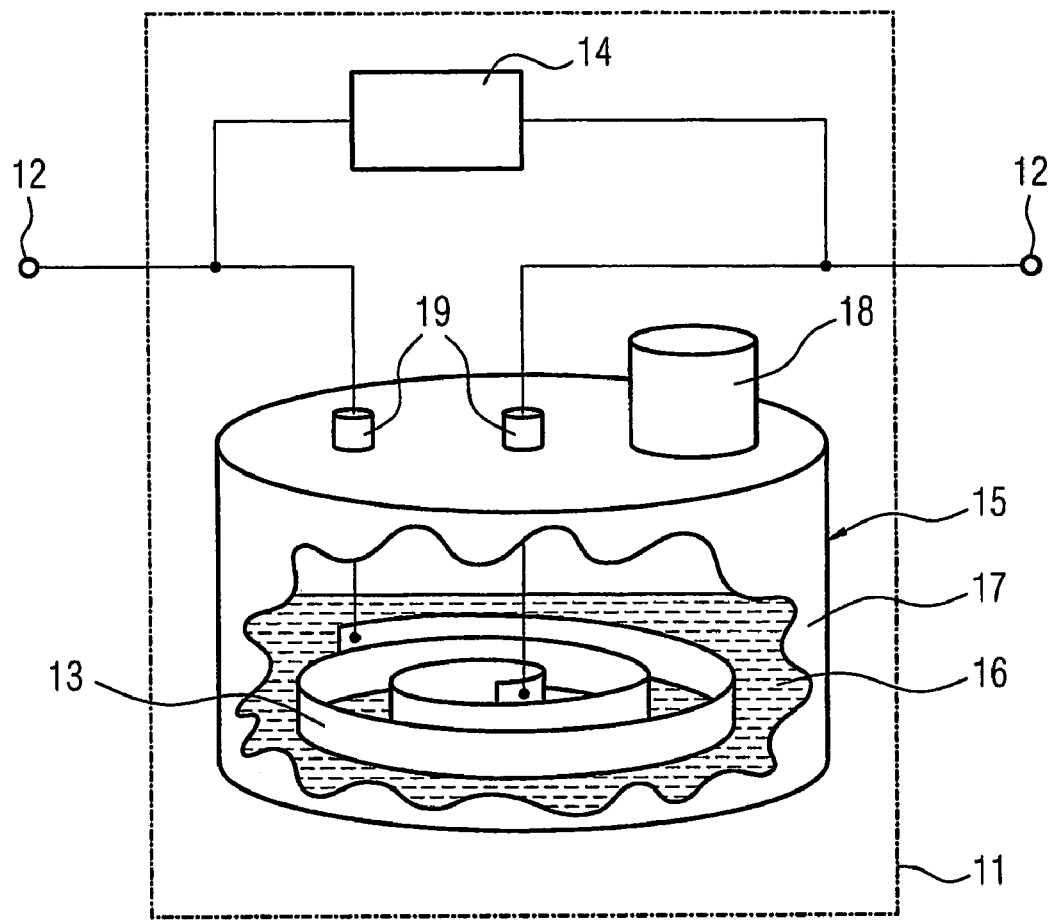

Aritake T et al: "Relation between critical current density and flux flow resistivity in Bi2223 bulk element for fault current limiter" IEEE Transactions on Applied Superconductivity IEEE USA, vol. 13, No. 2, Jun. 2003, pp. 2084-2087, XP002348627 ISSN: 1051-8223 the whole document.

Weller R A et al: "Computer modelling of superconducting film type fault current limiters" IEEE Transactions on Applied Superconductivity IEEE USA, vol. 9, No. 2, Jun. 1999, pp. 1377-1380, XP002348610 ISSN: 1051-8223 p. 1377, col. 1, paragraph 1-p. 1378, col. 1, paragraph 1; table 1.

Matsumura T et al: "Performances of small fault current limiting breaker model with high Tc Superconductor" IEEE Transactions on Applied Superconductivity IEEE USA, vol. 15, No. 2, Jun. 2005, pp. ISSN: 1051-8223 p. 2114, col. 1, paragraph 1- p. 2115, col. 1, paragraph 2.

* cited by examiner

CURRENT-LIMITING DEVICE HAVING A SUPERCONDUCTIVE SWITCHING ELEMENT

BACKGROUND OF THE INVENTION

1 Field of the Invention

The invention relates to an electronic current-limiting device having a superconducting switching element which is arranged in a cryostat.

2 Description of the Related Art

A current-limiting device of the type mentioned in the introduction is known, for example, from DE 102 30 084 A1. This current-limiting device is operated in an electrical network. The current is carried by the superconducting switching element, which has a negligible small electrical resistance at the operating temperature which is maintained by continuous cooling. If a network fault (for example a short) occurs in the network, then the unacceptably high short-circuit current results in the superconducting switching element having a response which is referred to as quenching. The high current flow produces induction in the super conductor, which first of all slightly increases its electrical resistance. This changes the superconductor to the so-called flux-flow range, in which the superconducting material is in the Shubnikov phase. This response is described, for example, in W. Buckel, Supraleitung: Grandlagen und Anwendungen [Superconduction: Principles and Applications], Weinheim 1990. According to this document, normally conductive areas and superconducting areas are formed at the same time in the superconducting material in the Shubnikov phase and are formed by migrating normally conductive flux tubes in the said conductor. The increase in the resistance of the superconducting switching element associated with this leads to heating of the superconductor. This can also be accelerated if, as is generally normal, a communication conductor is applied as a layer on the superconductor and carries a portion of the short-circuit current when the superconductor enters the flux-flow range, producing additional heat because its resistance is considerably greater. The heating of the switching element leads in a very short time to a critical temperature being exceeded, above which the superconductor is normally conductive, that is to say it leaves the flux-flow range as a function of the temperature, and limits the short-circuit current to a short-circuit residual current owing to its suddenly rising resistance, which is now purely resistive.

In order to prevent damage to the superconducting switching element when the current is being limited, the switching element must have the load removed from it again at the latest 50 ms after response, and this is done for example by means of an electrical bypass element, whose resistance provides the current limiting. The superconducting switching element is disconnected from the network and cannot be operated again until it has cooled down to the original operating temperature.

DE 102 30 618 A1 describes a design for a superconducting current limiter which is achieved by the superconductor being in the form of a strip. The superconductor in the form of a strip is arranged in a spiral shape in the coolant, in such a manner that the coolant can reach the surface of the superconductor between the spiral turns. This makes it possible to shorten the cooling-down time after current limiting, so that the current-limiting device can be used relatively quickly again after the current has been limited. However, the described principle of operation means that cooling is required before the current limiter is used again.

SUMMARY OF THE INVENTION

The object of the invention is to specify an electrical current-limiting device having a superconducting switching element which is available without any restriction for current limiting when the current is being limited, and is immediately ready for use again after the current has been limited.

According to the invention, this object is achieved in that the switching element is designed in such a manner that it is in the Shubnikov phase on reaching the required short-circuit residual current of the current-limiting device when the current is being limited. According to the invention, the superconducting switching element must therefore be designed such that the only minor increase in the electrical resistance in comparison to the quenching of the superconductor during operation in the flux-flow range (that is to say when the superconductor is in the Shubnikov phase) is sufficient to limit the short-circuit current to the short-circuit residual current. This is achieved by the superconducting switching element having a sufficient conductor length to achieve the resistance which is necessary for the required short-circuit residual current just by being in the Shubnikov phase at a temperature which has a sufficient safety margin from the critical temperature (transition to the normally conductive state). The superconducting switching element may in particular be in the form of a strip conductor, which allows the required conductor length to be produced at low cost, in this way.

When the superconducting switching element is being operated in the flux-flow range, the superconducting switching element is heated only by a relatively small amount of a few Kelvin, in contrast to the situation during quenching. The heat that is produced can thus be reliably dissipated through the cryostat that is provided in order to cool the switching element, and this is additionally assisted by the fact that the strip conductor provides a comparatively large area for the heat transfer. It is thus possible by suitable design of the current limiting device to ensure a thermal equilibrium, when the current is being limited, between the heat which is produced by the short-circuit residual current and the heat which is dissipated by the coolant, so that the superconducting switching element is operated in a stable state. The superconducting switching element can thus limit the current even over a relatively long time period without any need to remove the load on it, for example by means of a bypass element. In addition, the cooling-down process by a few Kelvin can advantageously additionally take place in a very short time, so that the superconducting switching element is ready to operate again immediately after the current has been limited.

One refinement of the invention provides for the cooling power of the cryostat to be designed in such a manner that the switching element can be kept in a temperature range in which it is in the Shubnikov phase throughout the entire current-limiting time. This allows the current limiting device to be operated in a regime in which the superconducting switching element is always in the network and can carry out its function without any restriction. This advantageously results in a safety improvement because, for example, even network faults which occur at short time intervals one after the other can each initiate current limiting in the current limiting device. A further advantage is that the superconducting switching element can change completely reversibly between the superconducting phase and the Shubnikov phase when in the flux-flow range while the current is being limited, with no possibility of damage to the superconducting material.

One variant of the invention provides for the switching element to be provided with a thermal insulation layer. This advantageously allows the heat transferred between the superconducting switching element and the coolant in the cryostat to be influenced directly, thus allowing the current limiting device to be designed in a suitable form with regard to the formation of the thermal equilibrium when the current is being limited. This is because thermal insulation of the superconducting switching element results in the heat emission to the coolant in the cryostat being delayed, so that the superconducting switching element is heated to a greater extent, as a result of which the resistance is also increased. Nevertheless, the thermal insulation must not, of course, result in heating to the critical temperature.

According to another variant of the invention, the switching element is fitted with a commutation conductor which runs parallel to the switching element. The commutation conductor and the switching element may, for example, form a layer composite, with the layers of the switching element and of the commutation conductor following one another, that is to say being closely linked to one another. The commutation conductor advantageously improves the safety against local quenching of the switching element and, when the current is being limited, also carries a certain proportion of the short-circuit residual current, with this proportion being dependent on the ratio of the electrical resistance of the switching element when in the Shubnikov phase to that of the commutation conductor.

It is advantageous for the commutation conductor to be formed from a metal or a metal alloy with positive magnetic susceptibility. This increases the magnetic induction (B) in the layer composite comprising the switching element and the commutation conductor as soon as a magnetic field passes through the commutation conductor. This is the situation, for example, when the commutation conductor is involved in carrying the current when the current is being limited.

Furthermore, it is advantageous for the switching element to run in a spiral shape in the cryostat. This advantageously allows the required length of the switching element to be accommodated in a space-saving manner, with the spiral profile allowing sufficient space for the coolant in the cryostat between respectively adjacent turns, in order to ensure direct heat transfer from the switching element to the coolant.

According to one additional variant of the invention, it is possible to provide for a bypass element to be arranged in parallel with the switching element. The electrical resistance of this bypass element is designed in such a manner that a specific portion of the short-circuit current flows via the bypass element, thus reducing the load on the switching element and possibly on the commutation conductor.

It is advantageous for the bypass element to be located outside the cryostat. This results in some of the heat that is produced by the current-limiting process being created in the bypass element and thus outside the cryostat, so that its cooling capacity is always sufficient for the superconducting switching element. In contrast to the situation in known current-limiting devices, the bypass element is, however, operated in parallel with the switching element throughout the entire time during which the current is being limited, that is to say the switching element remains connected to the network.

BRIEF DESCRIPTION OF THE DRAWING FIGURES

Figure 2:
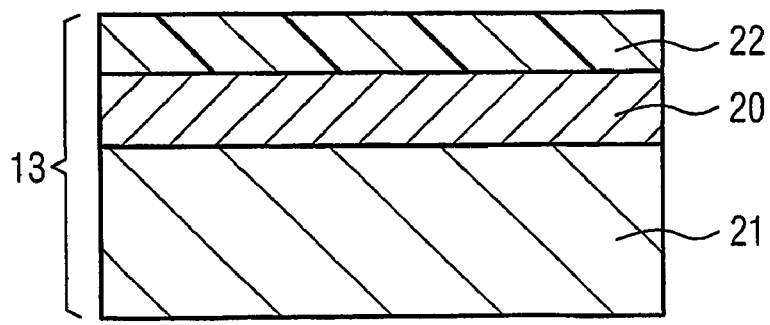
Figure 3:
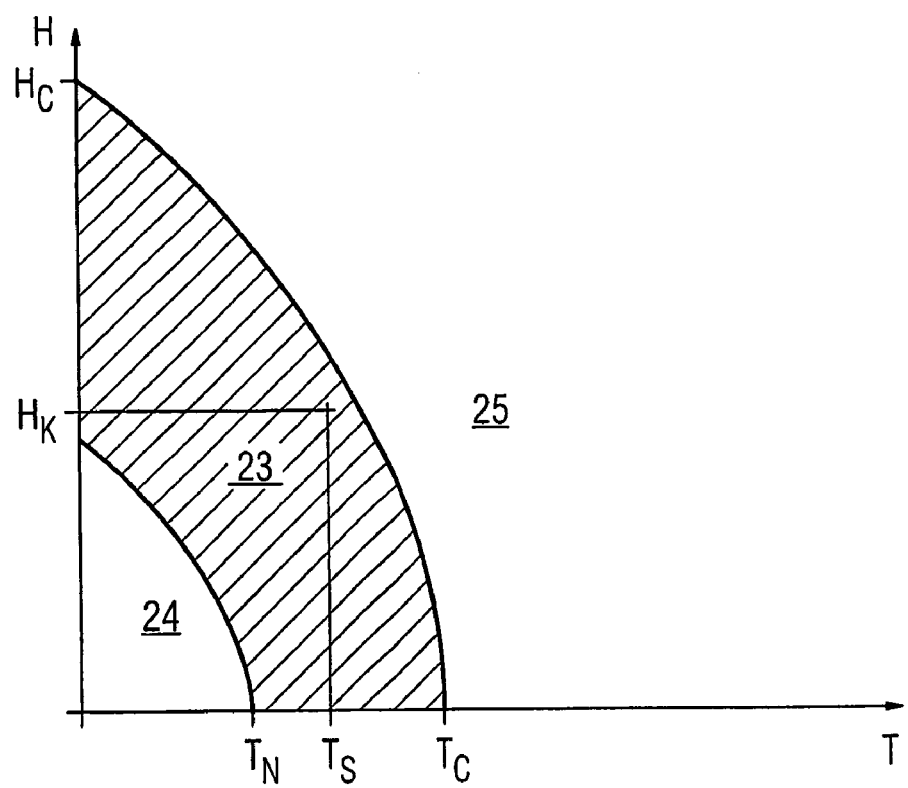
Figure 3:
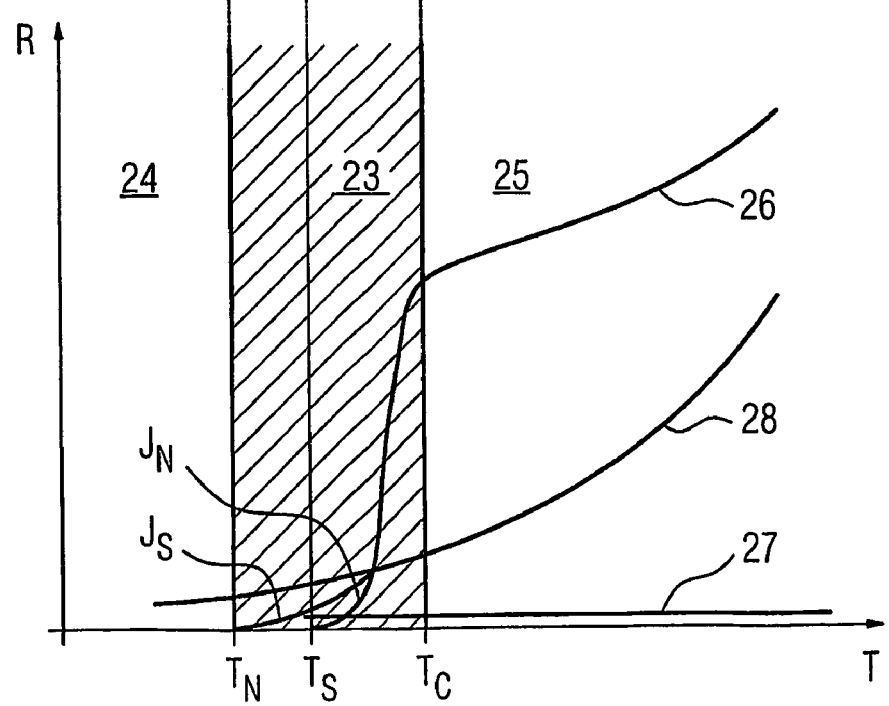

Further details of the invention will be described in the following text with reference to the drawing, in which:

FIG. 1 shows a highly schematic layout of one exemplary embodiment of the current limiting device according to the invention, FIG. 2 shows a cross section through one exemplary embodiment of the superconducting switching element, and FIG. 3 shows the resistance and magnetic field strength of the components in one exemplary embodiment of the current-limiting device according to the invention, as a function of the temperature.

DETAILED DESCRIPTION OF THE PREFERRED EMBODIMENTS

A current limiting device 11 has two connecting elements 12, by means of which it can be included in an electrical network. The current-limiting device 11 essentially comprises a superconducting switching element 13 and a bypass element 14, which is arranged in parallel with the switching element 13. The switching element 13 is accommodated in a cryostat 15 which, for this purpose, has an insulating container 17 that is filled with liquid nitrogen as the coolant 16. A cold head 18 dissipates the heat from the insulating container. Furthermore, line feeders 19 are provided on the insulating container 17 and allow electrical contact 11 to be made between the switching element 13 and the connecting elements 12 which are located outside the insulating container 17.

The superconducting switching element 13 is illustrated in the form of a section in FIG. 2. It is composed of a layer composite, with a superconducting layer 20 (for example YBCO) being produced by coating on a commutation conductor 21.

A thermal insulation layer 22, for example composed of plastic, is also applied to the superconducting layer 20. Layers which are important for the production of the superconducting layer 20, for example a buffer layer, can also be provided between the superconducting layer 20 and the commutation layer 21 (not illustrated in any more detail).

FIG. 3 shows the phased states that the superconducting switching element can assume. The Shubnikov phase 23, in which the superconducting switching element can be operated in the flux-flow range, is illustrated in a shaded form. The superconducting phase 24 is in each case located to the left of this, in which the switching element has a negligibly small electrical resistance; the normally conductive range 25 is located to the right of this, in which the switching element acts as a pure resistance. The switching element according to the invention is not intended to be operated in the normally conductive range 25.

The upper one of the diagrams shows that the existence of the Shubnikov phase 23 is dependent both on the temperature T and on the magnetic field strength H in the switching element. The superconductor is always in the normally conductive phase 25 above a critical field strength $H_C$ and a critical temperature $T_C$. Below $T_C$ and $H_C$, the relationship is valid that the critical temperature $T_{C(H)}$ decreases as the magnetic field strength rises, and the critical magnetic field strength $H_{C(T)}$ decreases in a corresponding manner as the temperature rises.

The lower of the diagrams shows the resistance profile of the components of the current limiting device as a function of the temperature. Rated operation of the current-limiting device takes place at $T_N$, in which case the Shubnikov phase has just not yet occurred at this temperature, so that the switching element is operated in the superconducting range. The electrical resistance of the switching element is negligibly small, so that the current is carried completely via the switching element, and there is virtually no current in the commutation conductor or the bypass element, whose electrical resistances are several orders of magnitude higher.

When the current is being limited (network fault such as a short circuit), the current being carried rises suddenly, resulting in induction being produced in the superconductor. The switching element thus enters the start of the flux-flow range, and its resistance increases suddenly. In consequence, a portion of the short-circuit current changes to the bypass and, in particular, also into the commutation conductor, in which case their resistance values at $T_N$, the temperature must be sufficiently low during normal operation, in order that they carry a significant proportion of the short-circuit current. The current in the commutation conductor also results in its magnetic induction rising, which in turn increases the resistance in the switching element, although the flux-flow range must not be left (see the above graph).

The switching element is heated during the described process, with the temperature increase at the same time being associated with increased heat emission to the coolant in the cryostat. The cooling power of the cryostat is sufficient for a steady state to be assumed at the temperature $T_S$ when current is being limited, at which the heat produced in the switching element is in equilibrium with the heat dissipated to the coolant. This prevents the switching element being heated beyond $T_S$, thus maintaining an adequate safety margin from the critical temperature $T_C$, and effectively preventing the quenching of the superconductor associated with this.

The lower graph in FIG. 3 also shows that the resistance increase in the switching element in the flux-flow range is considerably less than the resistance increase associated with the quenching of the superconductor. The superconducting switching element according to the invention must therefore be provided with an appropriate length to produce the resistance that is required for current limiting. As can also be seen, the resistance increase in the flux-flow range is also dependent on the current density J in the switching element. The resistance change in the current density during normal operation $J_N$ is thus less than in the case of the current density when the current is being limited $J_S$, with this resulting from the required short-circuit current taking into account the current components which are carried by the bypass element (curve 27) and the commutation conductor (curve 28). The distribution depends on the ratio of the resistances of the components in the current limiting device at the temperature $T_S$ when the current is being limited, and this can be read directly from the lower graph in FIG. 3. Resistance at the bypass element (curve 27) is not dependent on the temperature in the cryostat, since the bypass element is arranged outside the cryostat. The resistance of the commutation conductor (curve 28) has a temperature-dependant profile that is typical for normal conductors, with a material being chosen for the commutation conductor which has a relatively low resistance at $T_S$, in the vicinity of the resistance of the switching element at $T_S$. This makes it possible to reduce the current density in the switching element when the current is being limited.

The invention claimed is:

1. An electrical current-limiting device, comprising:
   a superconducting switching element (13) which is arranged in a cryostat (15) having a coolant (16),
   wherein the switching element (13) is designed in such a manner that the switching element (13) is in a Shubnikov phase on reaching a required short-circuit residual current of the current-limiting device when the current is being limited,
   and the switching element (13) is designed in such a manner that there is an equilibrium when the current is being limited, between heat that is produced by the short-circuit residual current in the switching element (13) and heat that is dissipated by the coolant (16).

2. The current-limiting device as claimed in claim 1, wherein a cooling power of the cryostat (15) is designed in such a manner that the switching element (13) can be kept in a temperature range in which the switching element (13) is in the Shubnikov phase throughout an entire current-limiting time.

3. The current-limiting device as claimed in claim 2, wherein the switching element (13) is provided with a thermal insulation layer.

4. The current-limiting device as claimed in claim 2, wherein the switching element (13) is fitted with a commutation conductor (21), which runs parallel to the switching element (13).

5. The current-limiting device as claimed in claim 4, wherein the commutation conductor (21) is formed from a metal or a metal alloy with positive magnetic susceptibility.

6. The current-limiting device as claimed in claim 2, wherein the switching element (13) runs in a spiral shape in the cryostat (15).

7. The current-limiting device as claimed in claim 2, wherein a bypass element (14) is arranged in parallel with the switching element.

8. The current-limiting device as claimed in claim 7, wherein the bypass element (14) is located outside the cryostat.

9. The current-limiting device as claimed in claim 1, wherein the switching element (13) is provided with a thermal insulation layer.

10. The current-limiting device as claimed in claim 1, wherein the switching element (13) is fitted with a commutation conductor (21), which runs parallel to the switching element (13).

11. The current-limiting device as claimed in claim 10, wherein the commutation conductor (21) is formed from a metal or a metal alloy with positive magnetic susceptibility.

12. The current-limiting device as claimed in claim 1, wherein the switching element (13) runs in a spiral shape in the cryostat (15).

13. The current-limiting device as claimed in claim 1, wherein a bypass element (14) is arranged in parallel with the switching element.

14. The current-limiting device as claimed in claim 13, wherein the bypass element (14) is located outside the cryostat.

* * * * *